US012756309B2

(12) United States Patent
Ng et al.

(10) Patent No.: US 12,756,309 B2
(45) Date of Patent: Oct. 6, 2026

(54) CONTROLLING A POWER SUPPLY

(71) Applicant: Teradyne, Inc., North Reading, MA (US)

(72) Inventors: Poh Keong Ng, Medford, MA (US); Benjamin Fisher, Peabody, MA (US)

(73) Assignee: Teradyne, Inc., North Reading, MA (US)

( * ) Notice: Subject to any disclaimer, the term of this patent is extended or adjusted under 35 U.S.C. 154(b) by 192 days.

(21) Appl. No.: 18/417,911

(22) Filed: Jan. 19, 2024

(65) Prior Publication Data

US 2025/0239937 A1 Jul. 24, 2025

(51) Int. Cl.

| | |
|---|---|
| ***H02M 3/156*** | (2006.01) |
| ***G01R 31/28*** | (2006.01) |
| ***H02M 1/00*** | (2007.01) |
| ***H02M 3/157*** | (2006.01) |

(52) U.S. Cl.

CPC ....... *H02M 3/1566* (2021.05); *H02M 1/0025* (2021.05); *H02M 3/157* (2013.01); *G01R 31/2834* (2013.01)

(58) Field of Classification Search

CPC .... H02M 1/0025; H02M 1/14; H02M 3/1566; H02M 3/157; G01R 31/2834

See application file for complete search history.

(56) References Cited

U.S. PATENT DOCUMENTS

| | | | | |
|---|---|---|---|---|
| 6,057,793 | A | 5/2000 | Gong et al. | |
| 6,396,252 | B1 | 5/2002 | Culpepper et al. | |
| 7,236,110 | B2 | 6/2007 | Antonesei | |
| 8,330,437 | B1 * | 12/2012 | Hartman | H02M 3/1588 323/222 |

(Continued)

FOREIGN PATENT DOCUMENTS

| | | | | |
|---|---|---|---|---|
| CN | 113933648 A | | 1/2022 | |
| CN | 117895786 A | * | 4/2024 | H02M 1/0012 |

(Continued)

OTHER PUBLICATIONS

Acanski, M., "Improving Load Transient Response of DC/DC Converters Powering Controlled Loads," Texas Instruments Application Report SLVAEEO [online] Retrieved from the Internet: <URL:https://www.ti.com/lit/an/slvaee0/slvaee0.pdf> [retrieved on Feb. 22, 2024] (c) 2019 Texas Instruments Incorporated, 8 pages.

(Continued)

*Primary Examiner* — Crystal L Hammond
*Assistant Examiner* — Nicolas Alden Chapa Mills
(74) *Attorney, Agent, or Firm* — ARENTFOX SCHIFF LLP

(57) ABSTRACT

An example system includes a switched mode power supply to provide an output voltage. The output voltage includes a predefined voltage and a droop or kick voltage that deviates from the predefined voltage. Control circuitry is configured to control the switched mode power supply based on a first voltage and a second voltage to reduce the droop or kick voltage at least partly. The control circuitry includes first circuitry including digital circuitry configured to obtain the first voltage based on the output voltage, and second circuitry including analog circuitry configured to obtain the second voltage based on the output voltage.

19 Claims, 8 Drawing Sheets

(56) References Cited

U.S. PATENT DOCUMENTS

| | | | | |
|---|---|---|---|---|
| 8,885,376 | B2 * | 11/2014 | Meehan | H02M 1/14<br>333/184 |
| 9,318,955 | B2 * | 4/2016 | Shimizu | H02M 3/157 |
| 2012/0051407 | A1 | 3/2012 | Ji et al. | |
| 2016/0277007 | A1 | 9/2016 | Tangudu et al. | |
| 2016/0329820 | A1 | 11/2016 | Mohtashemi et al. | |
| 2020/0301459 | A1 | 9/2020 | Bauer | |
| 2021/0050780 | A1 * | 2/2021 | Chiu | H02M 3/156 |
| 2023/0006556 | A1 * | 1/2023 | Sreenivas | H02M 3/1586 |
| 2023/0198506 | A1 | 6/2023 | Ponnapureddy et al. | |
| 2023/0223851 | A1 * | 7/2023 | Syu | H02M 1/0016<br>323/271 |
| 2025/0219543 | A1 * | 7/2025 | Zhang | H02M 3/1584 |

FOREIGN PATENT DOCUMENTS

| | | | |
|---|---|---|---|
| EP | 3907753 | A1 | 11/2021 |
| JP | 2014-107891 | A | 6/2014 |

OTHER PUBLICATIONS

Blok et al., "Variable Ratio Sample Rate Conversion Based on Fractional Delay Filter," Archives of Acoustics, vol. 39, No. 2, pp. 231-242 (2014), 12 pages.

Caffee, S., "Continuously Variable Fractional Rate Decimator," XILINX, XAPP936 (v1.1) Application Note: Virtex-5, Virtex-4, Spartan-3 (Mar. 5, 2007), 11 pages.

Cho et al., "Design of a Sample-Rate Converter From CD to DAT Using Fractional Delay Allpass Filter," IEEE Transactions on Circuits and Systems II: Express Briefs, vol. 54, pp. 19-23, DOI: 10.1109/TCSII.2006.885067 (2007), 5 pages.

Dick, C., "Options for Arbitrary Resamplers in FPGA-Based Modulators," Conference Record of the Thirty-Eighth Asilomar Conference on Signals, Systems and Computers, Pacific Grove, CA, USA, pp. 777-781, vol. 1, DOI: 10.1109/ACSSC.2004.1399241 (2004), 5 pages.

Lin-Shi et al., "Digital control strategies for switch-mode power supply," IECON 2006, Paris, France (2006), DOI: 10.1109/IECON.2006.347547, 6 pages.

Megaw et al., "4-Switch Buck-Boost Controller with Pass-Thru Capability Eliminates Switching Noise," Analog Devices Design Note, (20200), 3 pages.

Rajamani et al., "An efficient algorithm for sample rate conversion from CD to DAT," IEEE Signal Processing Letters, vol. 7, No. 10, pp. 288-290, DOI: 10.1109/97.870683 (2000), 3 pages.

"Sample-rate conversion," Wikipedia [online] Retrieved from URL: https://en.wikipedia.org/wiki/Sample-rate_conversion (Jan. 2, 2024), 3 pages.

Shahabuddin et al., "A Fractional Sample Rate Converter with Parallelized Multiphase Output: Algorithm and FPGA Implementation," Journal of Signal Processing Systems, vol. 94, iss. 12, pp. 1459-1469 (2022), 17 pages.

Yang, V., "Peak Current Mode and Continuous Current Mode DC-to-DC Converter Modeling and Loop Compensation Design Considerations," Analog Devices Technical Article, [online] Retrieved from the Internet: <URL:https://www.analog.com/en/resources/technical-articles/peak-current-mode-and-continuous-current-mode-dc-dc-converters.html> [retrieved on Feb. 22, 2024], (May 2016), 8 pages.

"80V VIN and VOUT Synchronous 4-Switch Buck-Boost DC/DC Controller," LT8705A, Linear Technology, [online] Retrieved from the Internet: <URL: http:www.linear.com/LT8705A> [retrieved on Feb. 22, 2024], © 2016 Linear Technology Corporation, 44 pages.

"Farrow Rate Converter: Polynomial sample-rate converter." [online] Retrieved from the Internet <URL:https://www.mathworks.com/help/dsphdl/ref/farrowrateconverter.html>, [retrieved on 20024-02-22], © 1994-2024 The MathWorks, Inc., 5 pages.

"Op-Amp Differentiator," [online] Retrieved from the Internet: <URL:https://www.circuitbread. com/tutorials/op-amp-differentiator> [retrieved on Feb. 22, 2024], (Aug. 19, 2022), 9 pages.

International search Report and written opinion received for PCT application No. PCT/US2025/011644, mailed on Apr. 30, 2025, 10 pages.

* cited by examiner

57
Load = 10A
Load = 0A
Faster response with feedforward circuit

Original response without Feedforward
61
$V_{OUT}$
60
60
Back to steady state
66
59 error = $V_{OUT}$ - $V_{REF}$
Error → 0
Error → 0
34

26
$V_{CONTROL}$
62

$V_{OUT\_FILTER}$
65

$V_{AMPLIFIED}$
Initial fast response from feedforward circuit to reduce Vout error. This happens before Vcontrol takes over to correct the Vout.

CONTROLLING A POWER SUPPLY

TECHNICAL FIELD

This specification describes example implementations of techniques for controlling a power supply, such as a switched-mode power supply.

BACKGROUND

A switched-mode power supply (SMPS) is a power supply that is configured to switch current to a load on and off in order to produce an output voltage. An example SMPS includes switches, which may be implemented using transistors, that open and close at a relatively high frequency. This operation of the switches connects and disconnects an energy storage system to and from the load in order to switch the current and thereby produce a direct current (DC) output voltage to the load.

SUMMARY

An example system includes a switched mode power supply to provide an output voltage. The output voltage includes a predefined voltage and a droop or kick voltage that deviates from the predefined voltage. Control circuitry is configured to control the switched mode power supply based on a first voltage and a second voltage to reduce the droop or kick voltage at least partly. The control circuitry includes first circuitry including digital circuitry configured to obtain the first voltage based on the output voltage, and second circuitry including analog circuitry configured to obtain the second voltage based on the output voltage. The system may include one or more of the following features, either alone or in combination.

The first circuitry may operate at a first speed and the second circuitry may operate at a second speed. The second speed may be greater than the first speed. The first circuitry may include a feedback circuitry and the second circuitry may include feedforward circuitry. The first circuitry may include a proportional-integral-derivative (PID) controller. The PID controller may be configured to obtain the output voltage and to output a third voltage that is based on the output voltage and a reference voltage. The first voltage may be based on the third voltage.

The system may include an inverting summing amplifier configured to sum a version of (e.g., an inversion of) the first voltage and the second voltage to produce a summed voltage. The control circuitry may be configured to control the switched mode power supply using the summed voltage. The second circuitry may include a notch filter to remove undesired switched mode power supply ripple voltage and to output a fourth voltage. The second circuitry may include at least one non-inverting differentiator configured to differentiate the fourth voltage to produce the second voltage. The second voltage may be a version of the fourth voltage having an increased slope. The at least one non-inverting differentiator may include two or more non-inverting differentiators each configured to differentiate the fourth voltage to produce a respective second voltage. Each respective second voltage may be based on the fourth voltage and may have an increased slope relative to the fourth voltage. The inverting summing amplifier may be configured to receive each respective second voltage.

The system may include a non-inverting summing amplifier (e.g., instead of an inverting summing amplifier) that is configured to sum the first voltage and a version of (e.g., an inversion of) the second voltage to produce a summed voltage. The control circuitry may be configured to control the switched mode power supply using this summed voltage. The second circuitry may include a notch filter to remove undesired switched mode power supply ripple voltage and to output a fourth voltage. The second circuitry may include at least one inverting differentiator configured to differentiate the fourth voltage to produce the second voltage. The second voltage may be a version of the fourth voltage having an increased slope. The at least one inverting differentiator may include two or more inverting differentiators each configured to differentiate the fourth voltage to produce a respective second voltage. Each respective second voltage may be based on the fourth voltage and may have an increased slope relative to the fourth voltage. The non-inverting summing amplifier may be configured to receive each respective second voltage.

The control circuitry may be configured to control the switched mode power supply to counteract the droop or kick voltage by 50% or more. The system may be part of automatic test equipment (ATE) configured to test a device under test (DUT). The DUT may be powered based on the output voltage. The system may include a power distribution network that includes one or more cables between the switched mode power supply and the DUT.

An example method includes the following operations: generating an output voltage using a switched mode power supply, where the output voltage includes a predefined voltage and a droop or kick voltage that deviates from the predefined voltage; obtaining a first voltage that is based on the output voltage, where the first voltage is obtained at a first speed; obtaining a second voltage that is based on the output voltage, where the second voltage is obtained at a second speed that is greater than the first speed; and controlling the switched mode power supply based on the first voltage and the second voltage to counteract the droop or kick voltage at least partly. The example method may include one or more of the following features, either alone or in combination.

Controlling the switched mode power supply may include the following operations: generating a summed voltage that is based on the first voltage and the second voltage; and using the summed voltage to control the switched mode power supply. Counteracting the droop or kick voltage may include reducing the droop or kick voltage by 50% or more.

The output voltage may be associated with a device powered by the switched mode power supply. Controlling the switched mode power supply based on the first voltage may be performed using feedback circuitry. Controlling the switched mode power supply based on the second voltage may be performed using feedforward circuitry. The feedback circuitry may be or include digital circuitry and the feedforward circuitry be or include analog circuitry.

Any two or more of the features described in this specification, including in this summary section, may be combined to form implementations not specifically described in this specification.

At least part of the devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and processes described in this specification may be configured or controlled using a computing system comprised of one or more processing devices and memory storing instructions that are executable by the one or more processing devices to perform various control operations. The devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
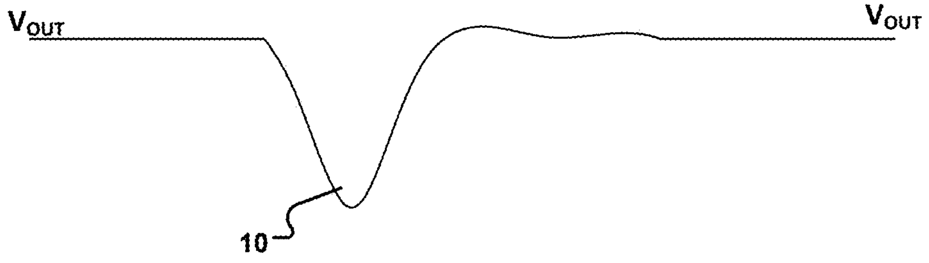
FIG. 1 is a diagram showing an example droop voltage produced by a power supply.
Figure 2:
FIG. 2 is a diagram showing an example kick voltage produced by a power supply.

Some power supplies, such as a switched-mode power supply (SMPS), produce a kick or droop voltage during operation. In an example, an SMPS is configured to produce a steady-state output voltage ($V_{OUT}$) having a predefined magnitude, such as a direct current (DC) voltage. However, in some SMPSs, the output voltage deviates from the predefined magnitude in either the positive or negative direction, particularly when the SMPS begins operation. A positive deviation is referred to as a kick voltage and a negative deviation is referred to as a droop voltage. An example of a droop voltage 10 is shown in FIG. 1 and an example of a kick voltage 11 is shown in FIG. 2. In some examples, the droop or kick voltage may deviate from the predefined magnitude by 10% or more or by 5% or more and may exist for a relatively short duration.

Nevertheless, the droop or kick voltage can adversely affect operation of a device powered by the SMPS. For example, an electronic device under test (DUT), such as a microprocessor or consumer electronic device, may be intended to operate at the output voltage. A voltage in excess of, or below, the output voltage may affect device operation and/or results of testing performed on the DUT. Accordingly, the example systems and processes described herein are configured to reduce the droop or kick voltage at least partly including, but not limited to, during testing.

An example system includes control circuitry configured to control the SMPS to generate the output voltage. At least initially, the output voltage from the SMPS includes a droop or kick voltage. The control circuitry includes digital circuitry, which may include feedback circuitry, configured to obtain a first voltage based on the output voltage. The control circuitry also includes analog circuitry, which may include feedforward circuitry, configured to obtain a second voltage based on the output voltage. The system uses the first voltage and the second voltage to reduce the magnitude and/or duration of the droop or kick voltage.

For example, the control circuitry controls the SMPS using a combination of the first voltage and the second voltage. In some examples, the analog circuitry is configured to function at a greater speed than the digital circuitry, at least in part because the analog circuitry need not take time to execute instructions to function. The analog circuitry is configured to detect the droop or kick voltage in the output voltage and to generate the second voltage to compensate for—for example, to counteract or reduce, fully or at least partly—the droop or kick voltage at the output of the SMPS. The digital circuitry is also configured to generate the first voltage to compensate for—for example, to counteract or to reduce, fully or at least partly—at least part of the droop or kick voltage not compensated for by the second voltage.

By using analog circuitry to at least partly the control the SMPS, the systems and processes described herein may counteract or reduce at least part of the droop or kick voltage in the output voltage more quickly than in systems and process that use digital control alone. This is advantageous at least because it may reduce the time that a device powered by the SMPS is subjected to droop or kick voltage. This is advantageous at least because it may reduce the magnitude of the droop or kick voltage that a device powered by the SMPS is subjected to.

In this regard, counteracting or reducing the droop or kick voltage may include eliminating the droop or kick voltage entirely, reducing a magnitude of the droop or kick voltage without eliminating the droop or kick voltage entirely, reducing a duration of the droop or kick voltage without eliminating the droop or kick voltage entirely, or reducing a magnitude and a duration of the droop or kick voltage without eliminating the droop or kick voltage entirely. In some implementations, the control circuitry is configured to control the SMPS to counteract the droop or kick voltage by reducing a magnitude and/or duration of the droop or kick voltage 50% or more, 40% or more, 30% or more 25% or more, 20% or more, 10% or more, and so forth.

Figure 3:
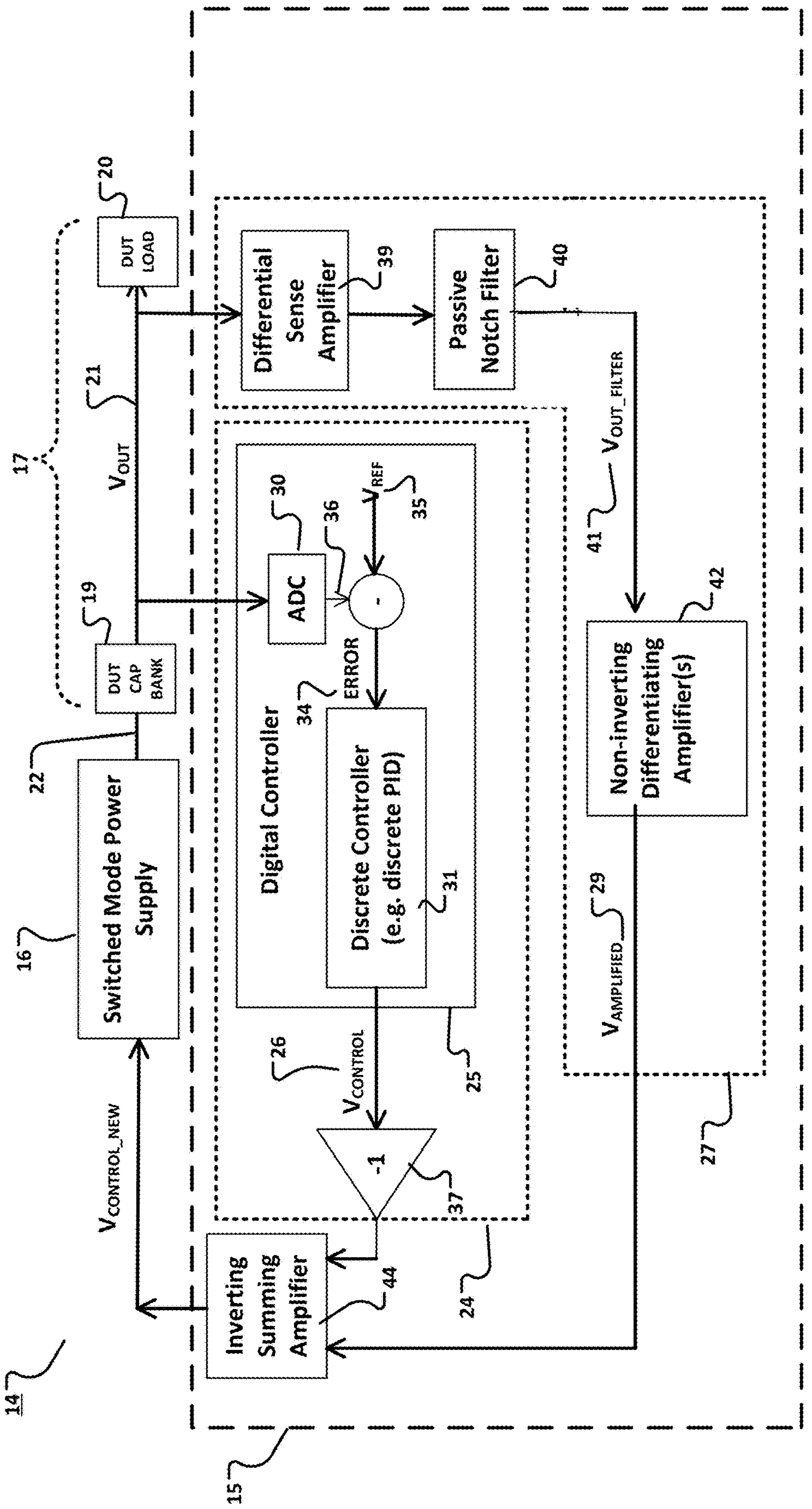
FIG. 3 is a block diagram of example control circuitry configured to reduce a droop or kick voltage in a power supply output voltage.

FIG. 3 is a block diagram of an example system 14 that includes control circuitry 15 configured to control SMPS 16 using the processes described herein. In this example, SMPS 16 is configured to provided power to a DUT 17. The DUT is not part of the control circuitry 15, but rather is where the control circuitry obtains measurements of the DC output voltage ($V_{OUT}$). The DUT may be any type of small form-factor electronic device, such as a microprocessor or controller, or it may be a larger form-factor device such as a smartphone containing electronics to be tested.

In this example, DUT 17 is shown as including a capacitor bank 19 and a load 20. Capacitor bank 19 includes one or more capacitors that are to be charged by current from SMPS 16. In some implementations, another energy storage device, such as one or more inductors may be used instead of capacitor bank 19. Capacitor bank 19 provides voltage to the load, which includes operational circuits within DUT 17. In some implementations, control circuitry 15 measure $V_{OUT}$ along a power distribution path 21 that electrically connects capacitor bank 19 to load 20. The droop or kick voltage in the output voltage ($V_{OUT}$) appears at this location. In some implementations, control circuitry 15 may measure $V_{OUT}$ along a power distribution path 22 that precedes capacitor bank 19 (not shown). This may be done, for example, if the DUT does not include a separate capacitor bank or energy storage device, or one that is externally accessible. The droop or kick voltage in the output voltage appears at this location. In general, the droop or kick voltage in the output voltage may be measured at any location where the droop or kick voltage appears in the output voltage.

System 14 also includes a power distribution network (PDN) 22. PDN 22 may include one or more power cables configured and arranged to transport power—including voltage and current—from SMPS 16 to capacitor bank 19. In some implementations, PDN 22 includes one or more switches, relays, or other active and/or passive electronic devices between SMPS 16 and capacitor bank 19.

Control circuitry 15 includes feedback circuitry 24. Feedback circuitry 24 includes digital circuitry 25 configured to generate a first control signal 26 to control SMPS 16 to reduce the droop or kick voltage. Control circuitry 15 also includes feedforward circuitry 27. Feedforward circuitry 27 includes analog circuitry configured to generate a second control signal 29 to control SMPS 16 to reduce the droop or kick voltage. Operation of digital circuitry 25 is relatively slow for reasons explained above and, in some implementations, will not respond to reduce the droop or kick voltage for one or more milliseconds (ms). Operation of the analog circuitry is relatively fast and, in some implementations, will respond to reduce the droop or kick voltage in a time period measured in single-digit microseconds (μs), such as 1 μs, or less.

In this example, digital circuitry 25 includes a digital microcontroller. The digital microcontroller may include an analog-to-digital converter (ADC) 30 configured to detected $V_{OUT}$ and to convert $V_{OUT}$ into digital form, and a discrete controller 31, such as a proportional-integral-derivative (PID) controller. An example PID controller 31 is configured to repetitively determine an error value (ERROR) 34 as a difference between a predefined voltage value (here, $V_{REF}$) 35 and a measured value, such as the digitized version of the output voltage, $V_{OUT}$, 36. $V_{REF}$ may be programmed via software/firmware into the digital controller. PID controller 31 is configured to apply a correction value that is based on proportional, integral, and derivative terms in order to reduce or to minimize the error. In this example, PID controller 31 may measure and process the measured value of $V_{OUT}$ and $V_{REF}$ over time to generate the first voltage-based control signal ($V_{CONTROL}$) 26. A version of this control signal, $V_{CONTROL}$, which may be the actual control signal or an inverted version thereof, is combined with a second control signal from feedforward circuitry 27 to control operation of SMPS 16—for example, to control the current output of SMPS 16—so that the droop of kick voltage is reduced.

In some implementations, PID controller 31 may be replaced with a P (proportional) controller, with a PI (proportional-integral) controller, or with any other appropriate type of digital controller.

In this example, feedback circuitry 24 also includes an inverting amplifier 37, such as an operational amplifier, which may be analog circuitry, and which may be configured to invert the control signal, $V_{CONTROL}$. In this example, the inverting amplifier does not apply a gain to the control signal, $V_{CONTROL}$, but rather only inverts the control signal, $V_{CONTROL}$, and hence is labeled "−1". The inversion is performed in this example because summing amplifier 44 described below inverts signals. This results in a double inversion to generate a signal having the correct polarity to apply to SMPS 16.

Control circuitry 15 also includes feedforward circuitry 27. Circuitry 27 is considered to be feedforward circuitry because circuitry 27 does not compare its input, namely the analog $V_{OUT}$, to a reference voltage. Rather, the output of circuitry 27 is a second voltage-based control signal, $V_{AMPLIFIED}$, 29 which is a product of a gain of the feedforward circuitry and its input, namely analog $V_{OUT}$. In some implementations, a version of this control signal, $V_{AMPLIFIED}$, is combined with a version of the first control signal, $V_{CONTROL}$, to control operation of SMPS 16—for example, to control the current output of SMPS 16—so that the droop of kick voltage is reduced. Is some implementations, the feedforward circuitry may over-correct the droop or kick voltage at least initially, but this over-correction may be corrected by feedback circuitry 24.

In this example, the analog circuitry in feedforward circuitry 27 includes a differential sense amplifier 39 to measure the output voltage, $V_{OUT}$. Feedforward circuitry 27 also includes a passive notch filter 40, which is configured to remove any switching ripple from SMPS 16 in the measured voltage, $V_{OUT}$. An example notch filter 40 includes a band-stop filter, which is a filter that attenuates frequencies within a specific range while passing other frequencies unaltered. Notch filter 40 outputs a filtered version of $V_{OUT}$, namely, $V_{OUT}$_FILTER, 41 in which voltage ripple from SMPS 16 has been eliminated or reduced. In some implementations, $V_{OUT}$_FILTER includes the droop or kick voltage only.

In this example, feedforward circuitry 27 also includes one or more non-inverting differential operational amplifier(s) 42. A non-inverting differential amplifier outputs a signal based on a rate of change of $V_{OUT}$, particularly the droop or kick voltage. In this regard, the droop or kick voltage may be relatively shallow which, absent differentiation, could dilute their effect(s) on the control signal, $V_{AMPLIFIED}$. In this example, non-inverting differential amplifier 42 amplifies the contribution of droop or kick voltage in the control signal, $V_{AMPLIFIED}$, by determining the slope of the droop or kick voltage through differentiation and using the slope of the drop or kick voltage as, or to generate, $V_{AMPLIFIED}$. In some implementations, the non-inverting differential amplifier 42 amplifies the droop or kick voltage using a predefined gain that is configured into the non-inverting differential amplifier. The control signal, $V_{AMPLIFIED}$, thus is or includes an amplified signal that is based on the droop or kick voltage.

In some implementations, feedforward circuitry 27 may include one non-inverting differential amplifier 42. In some implementations, feedforward circuitry 27 may include multiple non-inverting differential amplifiers 42, such as two, three, four, five, or more non-inverting differential amplifiers 42 configured to operate in parallel. This may be because the non-inverting differential amplifiers have a limited slew rate, which can slow operation of the analog circuitry that makes up feedforward circuitry 27. In this regard, the slew rate is the maximum rate of change of a differential amplifier's voltage. By using multiple differential amplifiers in parallel, the effects of this limited slew rate can be mitigated, since each operational amplifier need perform less amplification without a corresponding reduction in the time that the amplification is to be performed. By way of example, each such non-inverting differential amplifier 42 is configured to receive the control signal, $V_{OUT\_FILTER}$, and to output a version of the control signal, $V_{AMPLIFIED}$. In some implementations, the magnitude of each control signal, $V_{AMPLIFIED}$ may be inversely proportional to the number of non-inverting differential amplifiers 42 in feedforward circuitry 27. For example, if there is one non-inverting differential amplifier 42, then $V_{AMPLIFIED}$ is not attenuated. For example, if there are two non-inverting differential amplifiers 42 operating in parallel, then each non-inverting differential amplifier 42 is configured to output a control signal having a magnitude of $V_{AMPLIFIED}/2$. For example, if there are three non-inverting differential amplifiers 42 operating in parallel, then each non-inverting differential amplifier 42 is configured to output a control signal having a magnitude of $V_{AMPLIFIED}/3$; and so forth. $V_{AMPLIFIED}$, or multiple instances of $V_{AMPLIFIED}/2$, or multiple instances of $V_{AMPLIFIED}/3$, and so forth, are output to summing amplifier 44, as described below.

In some implementations, control circuitry 25 includes an inverting summing amplifier 44 that receives an inverted version of the output (the first control signal 26, $V_{CONTROL}$) of feedback circuitry 24 and the output (the second control signal 27, $V_{AMPLIFIED}$) of feedforward circuitry, which has not been inverted. Inverting summing amplifier 44 is configured to merge or to combine—for example, to sum—the inverted version of the first control signal, $V_{CONTROL}$ and the second control signal, $V_{AMPLIFIED}$, and to invert the resulting sum to produce a voltage-based control signal, $V_{CONTROL\_NEW}$. The control signal $V_{CONTROL\_NEW}$ is applied to SMPS 16 to control operation of SMPS 16 so that the droop or kick voltage portion of $V_{OUT}$ is reduced.

Figure 4:
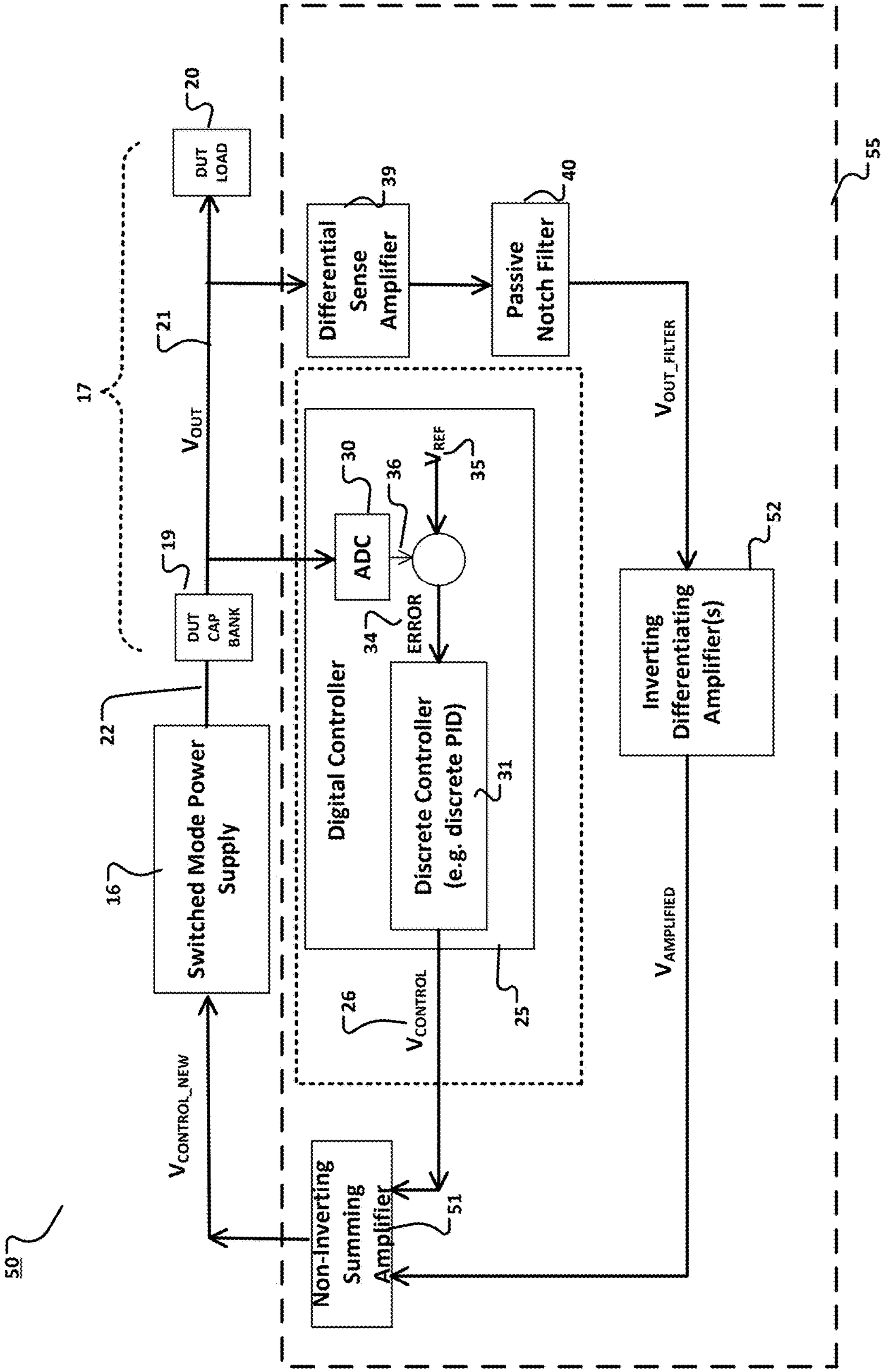
FIG. 4 is a block diagram of example control circuitry configured to reduce a droop or kick voltage in a power supply output voltage.

Referring to FIG. 4 in some systems 50, inverting summing amplifier 44 of FIG. 3 may be replaced with a non-inverting summing amplifier 51, and non-inverting differential amplifier(s) 42 may be replaced with one or more inverting differential amplifier(s) 52. In such implementations, inverting amplifier 37 of FIG. 3 may be omitted. These components affect the polarity of the signals internal to control circuitry 55 of FIG. 4. The functional operation of the circuitry in system 50 of FIG. 4 is the same as the functional operation of the circuitry in system 14 of FIG. 3, except that some of the signals in the circuitry of FIG. 4 are inverted relative to their counterparts in the circuitry of FIG. 3. Accordingly, the following description references system 14 of FIG. 3 only.

Figure 5:
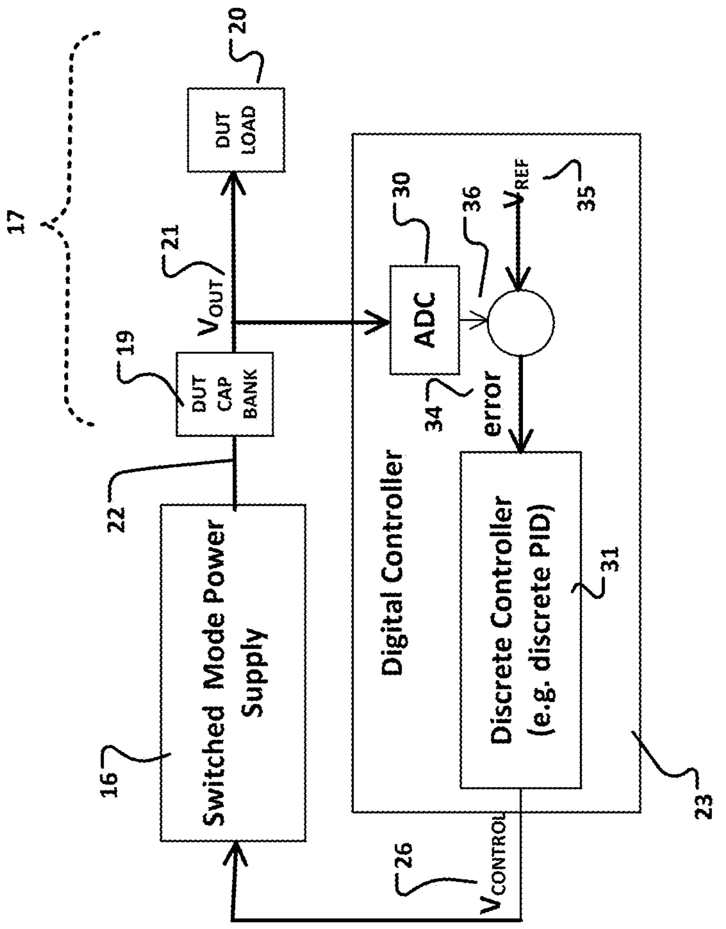
FIG. 5 is a block diagram of example digital feedback circuitry configured to reduce a droop or kick voltage in a power supply output voltage.

FIG. 5 shows a version 23 of feedback circuitry 24 of FIG. 3 in the absence of feedforward circuitry 27 and without the inverting amplifier 27. The components of FIG. 5 are otherwise identical to those of FIG. 3.

Figure 6A:
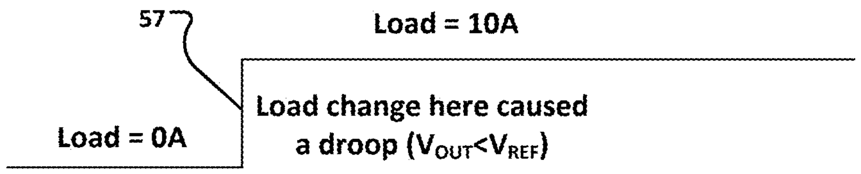
FIG. 6A is a diagram showing an example current applied by a power supply to a device under test.

In FIG. 5, SMPS 16 connects to DUT 17. The load on the DUT can change, which may cause $V_{OUT}$ to deviate from its target value. As shown in FIG. 6A, in this example the load in the DUT draws 10 amperes (A) of current when connected. The change 57 in current from 0 A to 10 A produces a droop voltage 59 (FIG. 6B), which is addressed using the feedback circuitry of FIG. 5. As shown, droop voltage 59 is below the predefined magnitude 60 of $V_{OUT}$ and persists for a period of time, with oscillations 61 before settling to its steady state at the predefined magnitude. In some implementations, there are no oscillations before settling.

Figure 6B:
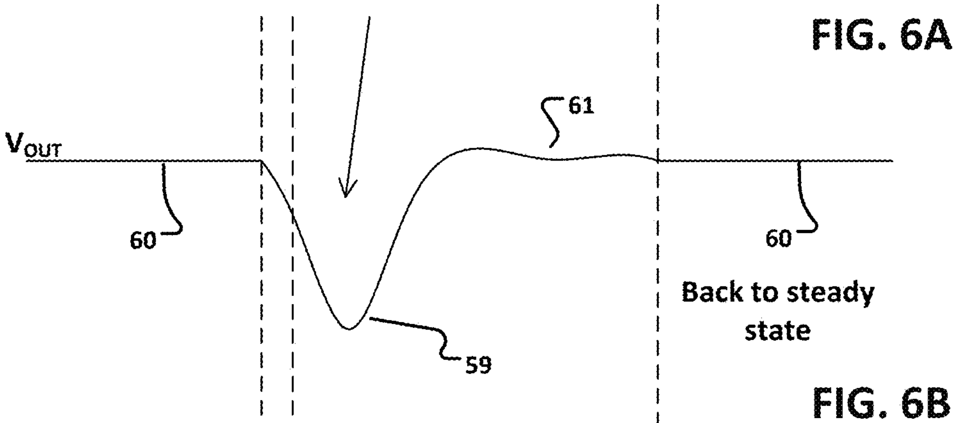
FIG. 6B is a diagram showing an example droop voltage produced by a power supply that has been addressed using digital feedback circuitry alone.
Figure 6C:
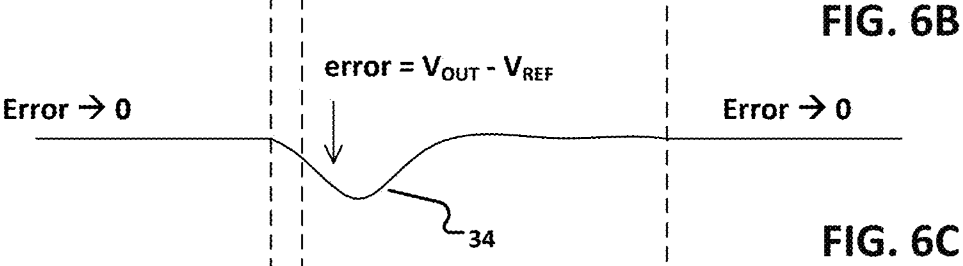
FIG. 6C is a diagram showing an example voltage that is a difference between the droop voltage and a reference voltage.
Figure 6D:
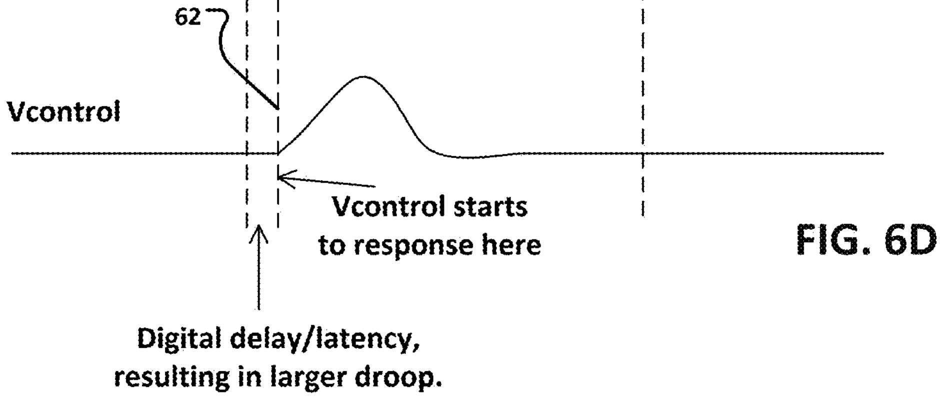
FIG. 6D is a diagram showing an example control signal to control a power supply produced to address the droop voltage.

In this example, the error value (ERROR 34 of FIG. 3, for example), which is the difference between $V_{OUT}$ and $V_{REF}$, is shown in FIG. 6C. PID controller 31 generates a control signal, $V_{CONTROL}$ 26, based solely on this error value. In this example shown in FIG. 6D, $V_{CONTROL}$ 26 is not inverted. As shown in FIG. 6D, the control signal, $V_{CONTROL}$ 26, starts to control SMPS 16 to counteract the droop voltage at time 62, which occurs at 1 μs or more (e.g., close to 2 μs) after the droop voltage 59 begins. This is referred to as the digital delay/latency, which may result in a larger droop voltage.

In implementations where SMPS 16 produces a kick voltage, the signals in FIGS. 6B, 6C, and 6D may be inverted; however, their magnitudes may remain the same or substantially the same, to the same effect.

Figures 7A, 7B, 7C, 7D, 7E, 7F:
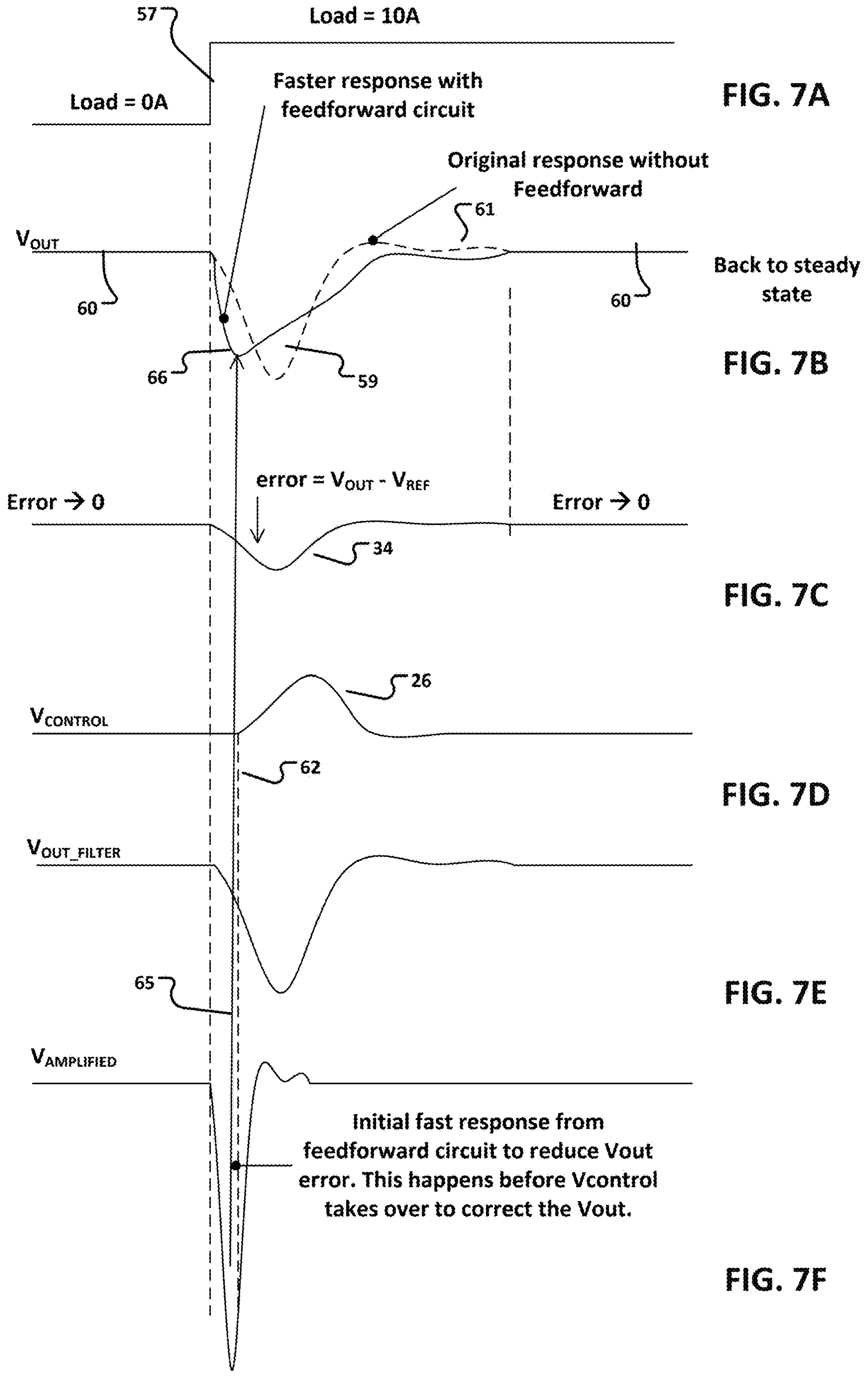
FIG. 7A is a diagram showing an example current applied by a power supply to a device under test.
FIG. 7B is a diagram showing an example droop voltage produced by a power supply that has been (i) addressed using the example digital feedback circuitry alone, and (ii) addressed also using digital feedback circuitry and analog feedforward circuitry.
FIG. 7C is a diagram showing an example voltage that is a difference between the droop voltage and a reference voltage.
FIG. 7D is a diagram showing an example control signal to control a power supply produced using the example digital feedback circuitry.
FIG. 7E is a diagram showing the droop voltage produced using filtering.
FIG. 7F is a diagram showing an example control signal to control a power supply produced using example analog feedforward circuitry.

FIGS. 7A to 7F shows signals produced during operation of feedback circuitry 24 in the presence of feedforward circuitry 27, as shown in FIG. 3 for example. In FIG. 7A, SMPS 16 connects to a DUT 17. The load on the DUT can change, which may cause $V_{OUT}$ to deviate from its target value. As shown in FIG. 7A, in this example the load in the DUT draws 10 amperes (A) of current when connected. The change 57 in current from 0 A to 10 A produces a droop voltage in $V_{OUT}$. FIG. 7B also shows droop voltage 59 of FIG. 6B in dashed lines to show how the droop voltage was addressed using digital feedback circuitry in the absence of analog feedforward circuitry 27.

In this regard, FIG. 7C and FIG. 7D are the same as FIGS. 6C and 6D, respectively, for the feedback circuitry and are reproduced here for completeness. FIG. 7E shows $V_{OUT\_FILTER}$, which is a representation of the droop voltage absent ripple in the signal. FIG. 7F shows $V_{AMPLIFIED}$, which is a faster response than $V_{CONTROL}$ from feedback circuitry 24, as shown by line 65. Note that $V_{AMPLIFIED}$ will be inverted by inverting summing amplifier 44 prior to application to SMPS 16. Also note that $V_{CONTROL}$ will be double inverted prior to application to SMPS 16. FIG. 7B shows droop voltage 66 reduced by feedforward circuitry 27. As shown in FIG. 7B, droop voltage 66 is less in magnitude, and addressed more quickly, than was the droop voltage addressed using feedback circuitry alone.

In implementations where SMPS 16 produces a kick voltage, the signals in FIGS. 7A to 7F may be inverted; however, their magnitudes may remain the same or substantially the same, to the same effect.

Figure 8:
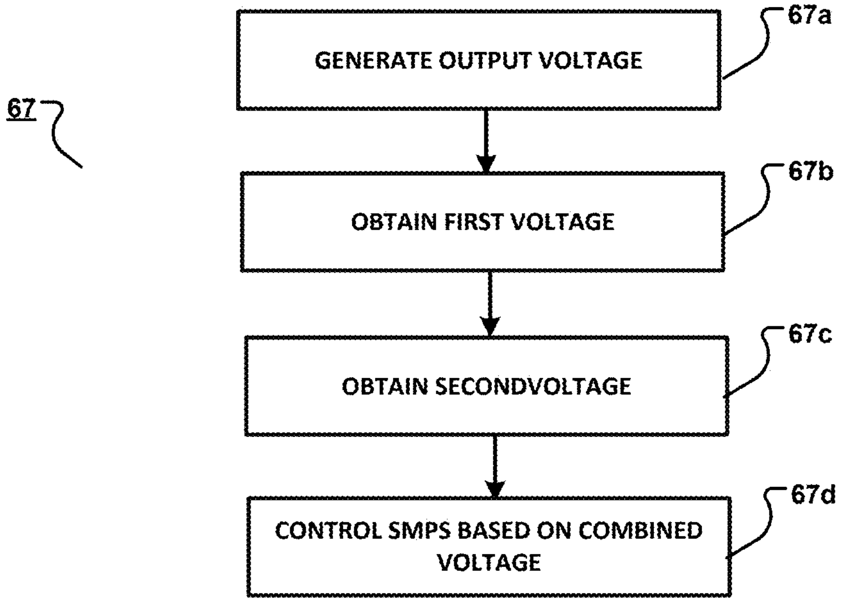
FIG. 8 is a flowchart showing an example process for controlling the voltage output of a power supply.

FIG. 8 is a flowchart showing an example process 67 for controlling a power supply, such as SMPS 16, to reduce the drop or kick voltage component in its output voltage. Process 67 may be performed using example control circuitry 15 of FIG. 3 or example control circuitry 55 of FIG. 4.

Process 67 includes generating (67*a*) an output voltage, such as a voltage applied to a DUT, using an SMPS 16. The output voltage, such as $V_{OUT}$, includes a predefined voltage and a droop or kick voltage that deviates from the predefined voltage. Process 67 includes obtaining (67*b*) a first voltage, such as $V_{CONTROL}$ or an inverted version of $V_{CONTROL}$, that is based on the output voltage, such as $V_{OUT}$. The first voltage is obtained using digital feedback circuitry 24 at a first speed, which may be one or more milliseconds or greater. Process 67 obtains (67*c*) a second voltage, such as $V_{AMPLIFIED}$ or an inverted version of $V_{AMPLIFIED}$, that is based on the output voltage, such as $V_{OUT}$. The second voltage is obtained by analog feedforward circuitry 27 at a second speed that is greater than the first speed, where the second speed may be on the order of single-digit microseconds (µs), such as 1 µs, or less. Process 67 includes controlling (67*d*) the SMPS based on the first voltage and the second voltage to counteract the droop or kick voltage at least partly. Controlling the SMPS may include generating a summed voltage that is based on the first voltage and the second voltage. For example, the summed voltage may be an inverted sum of: $V_{AMPLIFIED}$ and an inverted version of $V_{CONTROL}$. For example, the summed voltage may be a sum of: $V_{CONTROL}$ and an inverted version of $V_{AMPLIFIED}$. The summed voltage is a control signal that is applied to the SMPS to control the output of the SMPS to counteract—for example, to reduce the magnitude and/or duration of—the droop or kick voltage in (that is, the droop or kick component of) the output voltage ($V_{OUT}$).

Figure 9:
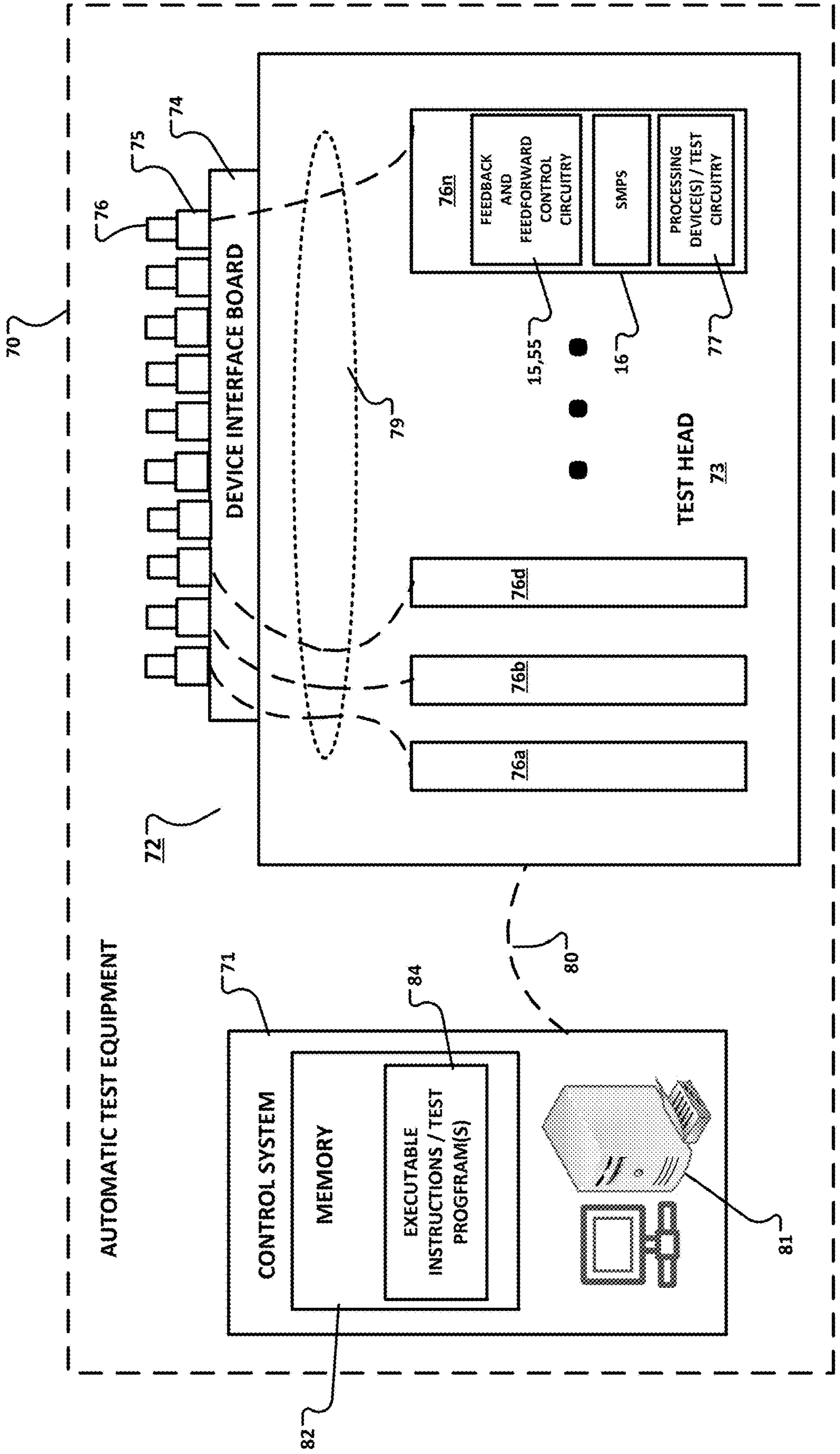
FIG. 9 is a block diagram of example test equipment in which the example circuitry and processes described herein may be implemented.

The control circuitry 15 of FIG. 3 or the control circuitry 55 of FIG. 4 may be part of automatic test equipment (ATE). FIG. 9 is a block diagram showing components of example ATE 70 that includes a testing device/apparatus (referred to also as a "tester") 72 and a control system 71.

ATE 70 includes a test head 73 and a device interface board (DIB) 74 connected physically and electrically to test head 73. In this example, DIB 74 includes a circuit board that includes mechanical and electrical interfaces at sites 75. One or more DUTs 76 connect to each of those sites for testing by the ATE. DIB 74 may include, among other things, connectors, conductive traces, conductive layers, and circuitry for routing signals between test instruments in the test head 73, DUTs connected to DIB sites, and other circuitry in the ATE. Power, including voltage, may be run, e.g., from one or more SMPSs, via one or more layers in the DIB to DUTs connected to the DIB.

Test head 73 includes multiple test instruments 76*a* to 76*n* (where n>3), each of which may be configured, as appropriate, to implement testing and/or other functions. Although only four test instruments are shown, ATE 70 may include any appropriate number of test instruments, including one or more residing outside of test head 73. The test instruments may be hardware devices that may include one or more processing devices and/or other circuitry 77. The test instruments may be configured—for example, programmed—to output test signals to test DUTs held on the DIB. The test signals to test the DUTs may be or include commands, instructions, data, parameters, variables, test patterns, and/or any other information designed to elicit response(s) from the DUT. Each test instrument may have a configuration like that of test instrument 76*n*, which includes one or more processing devices 77 for executing instructions to generate test signals to send to the DUTs, to communicate with control system 71, and to analyze responses to the test signals. In some implementations, one or more of (for example each of) the test instruments may include an SMPS 16 and control circuitry 15, 55 like that of FIG. 3 or 4 to power a DUT during testing.

In some implementations, test signals to test a DUT may be generated by test program(s) received by ATE 70 from an external system. In an example, a test program may be or include a set of instructions that are executed or interpreted by ATE 70 to produce test signals that the ATE uses to test the DUT.

Test channels 79 are configured between the test head and the DIB to enable communication between the DUTs and the test instruments.

Control system 71 is configured—e.g., programmed—to communicate with test instruments 76*a* to 76*n* to direct and/or to control testing of the DUTs. In some implementations, this communication 80 may be over a computer network or via a direct connection such as a computer bus or an optical medium. In some implementations, the computer network may be or include a local area network (LAN) or a wide area network (WAN). The control system may be or include a computing system comprised of one or more processing devices 81 (e.g., microprocessor(s)) and memory 82 for storing instructions to execute to control operation of the ATE and/or testing, and/or one or more test programs to execute and/or to send to the test instruments for execution. Control system 71 may be configured to provide test programs and/or test signals to test instruments 76*a* to 76*n* in the test head, which the test instrument(s) use to test the DUT. Control system 71 may also be configured to receive DUT response signals (e.g., measurement data) from the test instrument(s) and to determine whether the corresponding DUT has passed or failed testing.

In some implementations, the control functionality is centralized in processing device(s) 81. In some implementations, all or part of the functionality attributed to control system 71 may also or instead be implemented on a test instrument and/or all or part of the functionality attributed to one or more test instruments may also or instead be implemented on control system 71. For example, the control system may be distributed across processing device(s) 81 and one or more of test instruments 76*a* to 76*n*.

In some implementations, the control system may program $V_{REF}$ into PID controller 71. $V_{REF}$ may be changed by the control system, for example, if the control system 71 controls an SMPS 16 to provide a different value of $V_{OUT}$.

All or part of the systems and processes described herein including but not limited to process 67 and its modifications may be configured and/or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

As used herein, the terms “comprises,” “comprising,” “includes,” “including,” “has,” “having,” “contains,” “containing,” and any variations thereof, are intended to cover a non-exclusive inclusion, such that systems, techniques, apparatus, structures, processes, or other subject matter described or claimed herein that includes, has, or contains an element or list of elements does not include only those elements but can include other elements not expressly listed or inherent to such systems, techniques, apparatus, structures, processes or other subject matter described or claimed herein.

All examples described herein are non-limiting.

In the description and claims provided herein, the adjectives “first”, “second”, “third”, and the like do not designate priority or order unless context suggests otherwise. Instead, these adjectives may be used solely to differentiate the nouns that they modify.

Any mechanical or electrical connection herein may include a direct physical connection or an indirect physical connection that includes one or more intervening components unless context suggests otherwise. A connection between two electrically conductive components includes an electrical connection unless context suggests otherwise. The signals described herein are electrical signals unless context suggests otherwise.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising:

a switched mode power supply to provide an output voltage, the output voltage comprising a predefined voltage and a droop or kick voltage that deviates from the predefined voltage; and control circuitry configured to control the switched mode power supply based on a first voltage and a second voltage to reduce the droop or kick voltage at least partly, the control circuitry comprising:

first circuitry comprising digital circuitry configured to obtain the first voltage based on the output voltage, the first circuitry comprising feedback circuitry; and second circuitry comprising analog circuitry configured to obtain the second voltage based on the output voltage, the second circuitry comprising feedforward circuitry.

2. The system of claim 1, wherein the first circuitry operates at a first speed and the second circuitry operates at a second speed, the second speed being greater than the first speed.

3. The system of claim 1, wherein the first circuitry comprises a proportional-integral-derivative (PID) controller, the PID controller being configured to receive the output voltage and to output a third voltage that is based on the output voltage and a reference voltage, the first voltage being based on the third voltage.

4. The system of claim 3, further comprising:

an inverting summing amplifier configured to sum a version of the first voltage and the second voltage to produce a summed voltage, the control circuitry to control the switched mode power supply using the summed voltage.

5. The system of claim 4, wherein the second circuitry comprises a notch filter to remove undesired switched mode power supply ripple voltage and to output a fourth voltage.

6. The system of claim 5, wherein the second circuitry comprises at least one non-inverting differentiator configured to differentiate the fourth voltage to produce the second voltage, the second voltage comprising a version of the fourth voltage having an increased slope.

7. A system comprising:

a switched mode power supply to provide an output voltage, the output voltage comprising a predefined voltage and a droop or kick voltage that deviates from the predefined voltage; and control circuitry configured to control the switched mode power supply based on a first voltage and a second voltage to reduce the droop or kick voltage at least partly, the control circuitry comprising:

first circuitry comprising digital circuitry configured to obtain the first voltage based on the output voltage; and second circuitry comprising analog circuitry configured to obtain the second voltage based on the output voltage;

wherein the first circuitry comprises a proportional-integral-derivative (PID) controller, the PID controller being configured to receive the output voltage and to output a third voltage that is based on the output voltage and a reference voltage, the first voltage being based on the third voltage;

wherein the system further comprises an inverting summing amplifier configured to sum a version of the first voltage and the second voltage to produce a summed voltage, the control circuitry to control the switched mode power supply using the summed voltage;

wherein the second circuitry comprises a notch filter to remove undesired switched mode power supply ripple voltage and to output a fourth voltage;

wherein the second circuitry comprises at least one non-inverting differentiator configured to differentiate the fourth voltage to produce the second voltage, the second voltage comprising a version of the fourth voltage having an increased slope; and wherein the at least one non-inverting differentiator comprises two or more non-inverting differentiators each configured to differentiate the fourth voltage to produce a respective second voltage, each respective second voltage being based the fourth voltage and having an increased slope relative to the fourth voltage.

8. The system of claim 7, wherein the inverting summing amplifier is configured to receive each respective second voltage.

9. The system of claim 3, further comprising:

a non-inverting summing amplifier that is configured to sum the first voltage and a version of the second voltage to produce a summed voltage, the control circuitry to control the switched mode power supply using the summed voltage.

10. The system of claim 9, wherein the second circuitry comprises a notch filter to remove undesired switched mode power supply ripple voltage and to output a fourth voltage.

11. The system of claim 10, wherein the second circuitry comprises at least one inverting differentiator configured to differentiate the fourth voltage to produce the second voltage, the second voltage comprising a version of the fourth voltage having an increased slope.

12. The system of 11, wherein the at least one inverting differentiator comprises two or more inverting differentiators each configured to differentiate the fourth voltage to produce a respective second voltage, each respective second voltage being based the fourth voltage and having an increased slope relative to the fourth voltage.

13. The system of claim 12, wherein the non-inverting summing amplifier is configured to receive each respective second voltage.

14. The system of claim 1, wherein the control circuitry is configured to control the switched mode power supply to counteract the droop or kick voltage by 50% or more.

15. The system of claim 1, wherein the system is part of automatic test equipment (ATE) configured to test a device under test (DUT); and wherein the DUT is powered based on the output voltage.

16. The system of claim 1, further comprising:

a power distribution network comprising one or more cables between the switched mode power supply and the DUT.

17. A method comprising:

generating an output voltage using a switched mode power supply, the output voltage comprising a predefined volage and a droop or kick voltage that deviates from the predefined voltage;

obtaining a first voltage using feedback circuitry that is digital, the first voltage being based on the output voltage, the first voltage being obtained at a first speed;

obtaining a second voltage using feedforward circuitry that is analog, the second voltage being based on the output voltage, the second voltage being obtained at a second speed that is greater than the first speed; and controlling the switched mode power supply based on the first voltage and the second voltage to counteract the droop or kick voltage at least partly.

18. The method of claim 17, wherein controlling the switched mode power supply comprises:

generating a summed voltage that is based on the first voltage and the second volage; and using the summed voltage to control the switched mode power supply.

19. The method of claim 18, wherein counteracting the droop or kick voltage comprises reducing the droop or kick voltage by 50% or more.

* * * * *